United States Patent
Chan

(10) Patent No.: US 7,782,705 B2
(45) Date of Patent: Aug. 24, 2010

(54) WORD LINE DECODER CIRCUIT

(75) Inventor: Jen-Chin Chan, Hsinchu County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 98 days.

(21) Appl. No.: 12/336,547

(22) Filed: Dec. 17, 2008

(65) Prior Publication Data
US 2010/0149901 A1 Jun. 17, 2010

(51) Int. Cl.
*G11C 8/00* (2006.01)

(52) U.S. Cl. .................. 365/230.06; 365/185.23; 365/189.14

(58) Field of Classification Search ............ 365/230.06, 365/185.23, 189.14
See application file for complete search history.

(56) References Cited

U.S. PATENT DOCUMENTS

| | | | | |
|---|---|---|---|---|
| 7,046,572 B2 * | 5/2006 | Hansen et al. | ............... | 365/229 |
| 7,626,883 B2 * | 12/2009 | Shimano et al. | ............. | 365/226 |
| 2002/0145906 A1 * | 10/2002 | Einaga et al. | ............. | 365/185.2 |
| 2009/0285047 A1 * | 11/2009 | Brown et al. | ........... | 365/230.06 |

* cited by examiner

*Primary Examiner*—Vu A Le
*Assistant Examiner*—Han Yang
(74) *Attorney, Agent, or Firm*—Jianq Chyun IP Office

(57) ABSTRACT

A word line decoder circuit is provided in the present invention. The word line decoder circuit comprises at least one local pre-decoder, at least one 3-transistors row driver, a controllable power supply, and a controllable pull-down circuit. The controllable power supply is controlled by an inversed sector select signal to provide a first voltage to the row driver and local pre-decoder. The local pre-decoder uses 5-transistors architecture, in which there are 2 PMOS transistors and 3 NOS transistors. The controllable pull-down circuit pulls down the local pre-decoder and is controlled by a sector select signal and pre-decoding signal. The local pre-decoder receives a local pre-decoding signal to select the row driver. When the row driver is selected, the row driver determines a word line according to a row driver pull-down signal and a row driver pull-up signal.

9 Claims, 6 Drawing Sheets

WORD LINE DECODER CIRCUIT

BACKGROUND OF THE INVENTION

1. Field of Invention

The present invention generally relates to the memory device, and more particularly to the word line decoder circuit of the memory device.

2. Description of Prior Art

The memory device has a plurality of memory cells. When there are a plurality of data being to be stored (or read), the memory device must receive the word line selected signal of each of the data, so as to store the plurality of the data in the corresponding memory cells (or read the plurality of the data from the corresponding memory cells) according to the word line selected signals. Accordingly, the word line driver circuit is adapted in the memory device to generate the word line selected signals.

Referring to FIG. 1, FIG. 1 is a circuit diagram showing a conventional word line decoder circuit 10 provided by Intel Corporation. The conventional word line decoder circuit 10 comprises a controllable pull-down circuit 11, eight local decoders 12_1~12_8, a PMOS transistor P4, and eight word line clusters 13_1~13_8. Wherein each of the word line clusters 13_1~13_8 comprises sixteen row drivers 14_1~14_16. Each of the local decoders 12_1~12_8 comprises a NMOS transistor N1 and two PMOS transistors P1, P2. The controllable pull-down circuit 11 comprises two NMOS transistors N2 and N3. Each of the row drivers 14_1~14_16 comprises a PMOS transistor P3 and two NMOS transistors N4, N5. The connections of all elements of the sector 10 of the conventional word line decoder circuit can be seen in FIG. 1, and are not be described herein.

Referring to FIG. 2, FIG. 2 is a circuit diagram showing the conventional word line decoder circuit 10 provided by Intel Corporation, when a word line WL<1> is selected. Now the conventional word line decoder circuit 10 is selected, and sector select signals BLKSEL and BLKSELHB are VCC and 0 respectively. The word line WL<1> is selected, and thus a local pre-decoding signal PREA<1> and a row driver select signal PRERN<L> are VCC and 0 respectively. Other local pre-decoding signals PREA<2>~PREA<7> are 0, other row driver select signals PRERN<2>~PRERN<16> are VPX, and a pre-decoding signal PREB<1> and a bias signal AWLH are 0 and VBIAS respectively. When operating in READ mode, power supplies VPIXH and VPXH are VPX, and a power supply VNX is 0.

The PMOS transistor P4 is turned on, and the node VPXX is VPX. The PMOS transistor P1 of the local decoder 12_1 and the NMOS transistor N1 of the local decoder 12_1 are turned on, and the NMOS transistors N2, N3 of the controllable pull-down circuit 11 are turned on. Thus a reset signal VGRST<1> is 0. Therefore, the PMOS transistor P2 of the local decoder 12_1 is turned on, and in the word line cluster 13_1, the NMOS transistors N5 of the row drivers 14_1~14_16 are turned off. The node VX<1> is VPX. The row driver select signal PRERN<1> is 0, and thus, in the word line cluster 13_1, the PMOS transistor P3 of the row driver 14_1 is turned on, and the NMOS transistor N4 of the row driver 14_1 is turned off. Therefore, the word line WL<1> is VPX. On the contrary, the other row driver select signals PRERN<2>~PRERN<16> are VPX. In the word line cluster 13_1, the PMOS transistors P3 of the row drivers 14_2~14_16 are turned off, and the NMOS transistors N4 of the row drivers 14_2~14_16 are turned on. Therefore, the word lines WL<2>~WL<16> is 0.

The PMOS transistors P1 of the local decoders 12_2~12_8 are turned on, and the NMOS transistors N1 of the local decoders 12_2~12_8 are turned off. Therefore reset signals VGRST<2>~VGRST<8> are VPX, and the PMOS transistors P2 of the local decoders 12_2~12_8 are turned off. The node VX<8> is high impendence. In the word line clusters 13_2~13_8, the NMOS transistors N5 of the row drivers 14_1~14_16 are turned on. The row driver select signal PRERN<1> is 0, and thus, in the word line clusters 13_2~13_8, the PMOS transistor P3 of the row drivers 14_1 is turned off, and the NMOS transistor N4 of the row driver 14_1 is turned off. Therefore, the word line WL<1> is 0. On the contrary, the other row driver select signals PRERN<2>~PRERN<16> are VPX. In the word line clusters 13_2~13_7, the PMOS transistors P3 of the row drivers 14_2~14_16 are turned off, and the NMOS transistors N4 of the row drivers 14_2~14_16 are turned on. Therefore, the word lines WL<2>~WL<16> is 0.

A size of each of the PMOS transistors P1 may be a design issue. Taking FIG. 2 as an example, when the sizes of the PMOS transistors P1 are small, the reset signal VGRST<1> is pulled down to 0 fast, the node VX<1> is pulled up to VPX fast, and the NMOS transistors N5 in the word line cluster 13_1 are turned off fast. Therefore, the selected word line WL<1> is pulled up to VPX fast. However, the reset signals VGRST<2>~VGRST<8> are pulled up to VPX slowly, and the NMOS transistors N5 in the word line clusters 13_2~13_8 are turned on slowly. Therefore, the non-selected word lines WL<17>~WL<128> are pulled down to 0 slowly.

On the contrary, when the sizes of the PMOS transistors P1 are large, the reset signals VGRST<2>~VGRST<8> are pulled up to VPX fast, and the NMOS transistors N5 in the word line clusters 13_2~13_8 are turned on fast. Therefore, the non-selected word lines WL<17>~WL<128> are pulled down to 0 fast. However, the reset signal VGRST<1> is pulled down to 0 slowly, and the NMOS transistors N5 in the word line cluster 13_1 are turned off slowly. If the reset signal VGRST<1> is too large, the NMOS transistors N5 of the row driver 14_1 in the word line cluster 13_1 might be turned on. Therefore, the selected word line WL<1> is pulled up to VPX slowly, or even not reached to VPX.

In summary, the sizes of the PMOS transistors P1 must fall in an appropriate range, so as to avoid slow read speeds for the non-selected and selected word lines.

Furthermore, still taking FIG. 2 as an example, except the PMOS transistor P3 and the NMOS transistor N4 of the row driver 14_1 in the word line cluster 13_1, all of the PMOS transistors P3 and the NMOS transistors N4 are charged to VPX. The NMOS transistors N4 of the word line clusters 13_2~13_8 are charged to VPX, too. In the real world, the voltage VPX is generated by an internal pump circuit. The power efficiency of the internal pump circuit is about 20%~30%, and hence having large power consumptions and a large setting time for setting VPX. Therefore a problem of a read speed for the selected word line occurs.

Accordingly, the conventional word line decoder circuit may have a problem of the read speeds for the selected or the non-selected word line, and a problem power of large power consumptions.

SUMMARY OF THE INVENTION

Accordingly, the present invention is directed to a word line decoder circuit having lower power consumption and higher operation speed.

The present invention provides a word line decoder circuit, and the word line decoder circuit comprises a controllable power supply, at least one local pre-decoder, at least one word line cluster, and at least one controllable pull-down circuit. The controllable power supply is controlled by an inversed sector select signal to provide a first voltage to at least one local pre-decoder. The local pre-decoder comprises a first PMOS transistor, a second PMOS transistor, a first NMOS transistor, a second NMOS transistor, and a third NMOS transistor. A gate of the first PMOS transistor is coupled to a bias voltage, and a source thereof is coupled to a second voltage. A gate of the second PMOS transistor is coupled to a drain of the first PMOS transistor, and a source thereof coupled to the controllable power supply. A gate of the first NMOS transistor is coupled to a local pre-decoding signal, and a drain thereof is coupled to the drain of the first PMOS transistor. A gate of the second NMOS transistor is coupled to the local pre-decoding signal. A gate of the third NMOS transistor is coupled to the gate of the second PMOS transistor, a drain thereof is coupled to a reset signal, and a source thereof is coupled to a drain of the second NMOS transistor. The word line cluster comprises at least one row driver, and the row driver comprises a third PMOS transistor, a fourth NMOS transistor, and a fifth NMOS transistor. A gate of the third PMOS transistor is coupled to a row driver pull-up signal, a source thereof is coupled to a drain of the second PMOS transistor, and a drain thereof is coupled to a word line. A gate of the fourth NMOS transistor is coupled to a row driver pull-down signal, a drain thereof is coupled to the drain of the third PMOS transistor, and a source thereof is coupled to a third voltage. A gate of the fifth NMOS transistor is coupled to the source of the third NMOS transistor, a drain thereof is coupled to a drain of the third PMOS transistor, and a source thereof is coupled to the third voltage. The controllable pull-down circuit is coupled to sources of the first and second NMOS transistors of the local pre-decoder and controlled by a pre-decoding signal and a sector select signal to pull down the sources of the second and third NMOS transistors of the local pre-decoder to the third voltage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
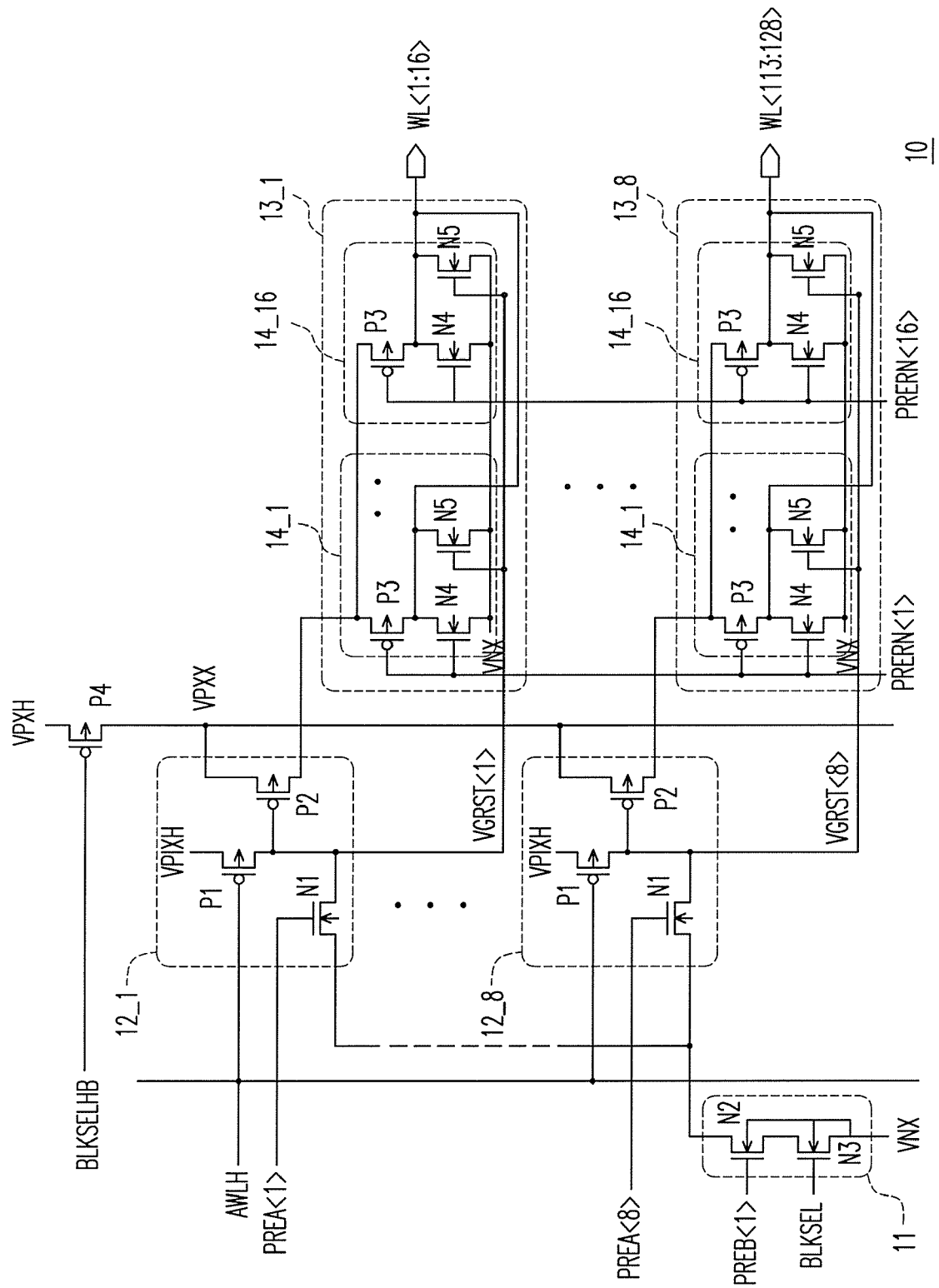
FIG. 1 is a circuit diagram showing a conventional word line decoder circuit 10 provided by Intel Corporation.
Figure 2:
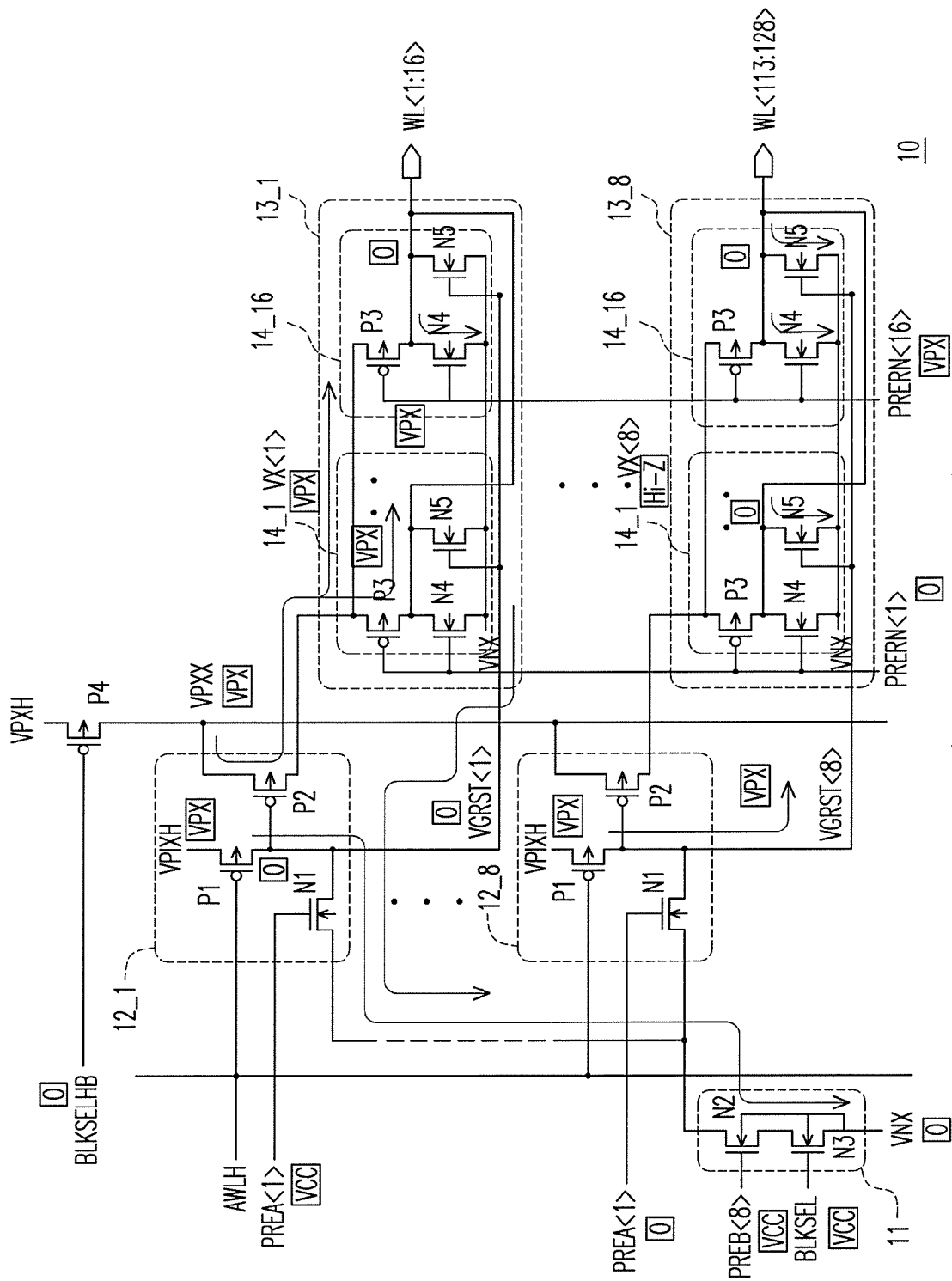
FIG. 2 is a circuit diagram showing the conventional word line decoder circuit 10 provided by Intel Corporation, when a word line WL<1> is selected.

Reference will now be made in detail to the present preferred embodiment of the invention, examples of which are illustrated in the accompanying drawings. Wherever possible, the same reference numbers are used in the drawings and the description to refer to the same or like parts.

Figure 3:
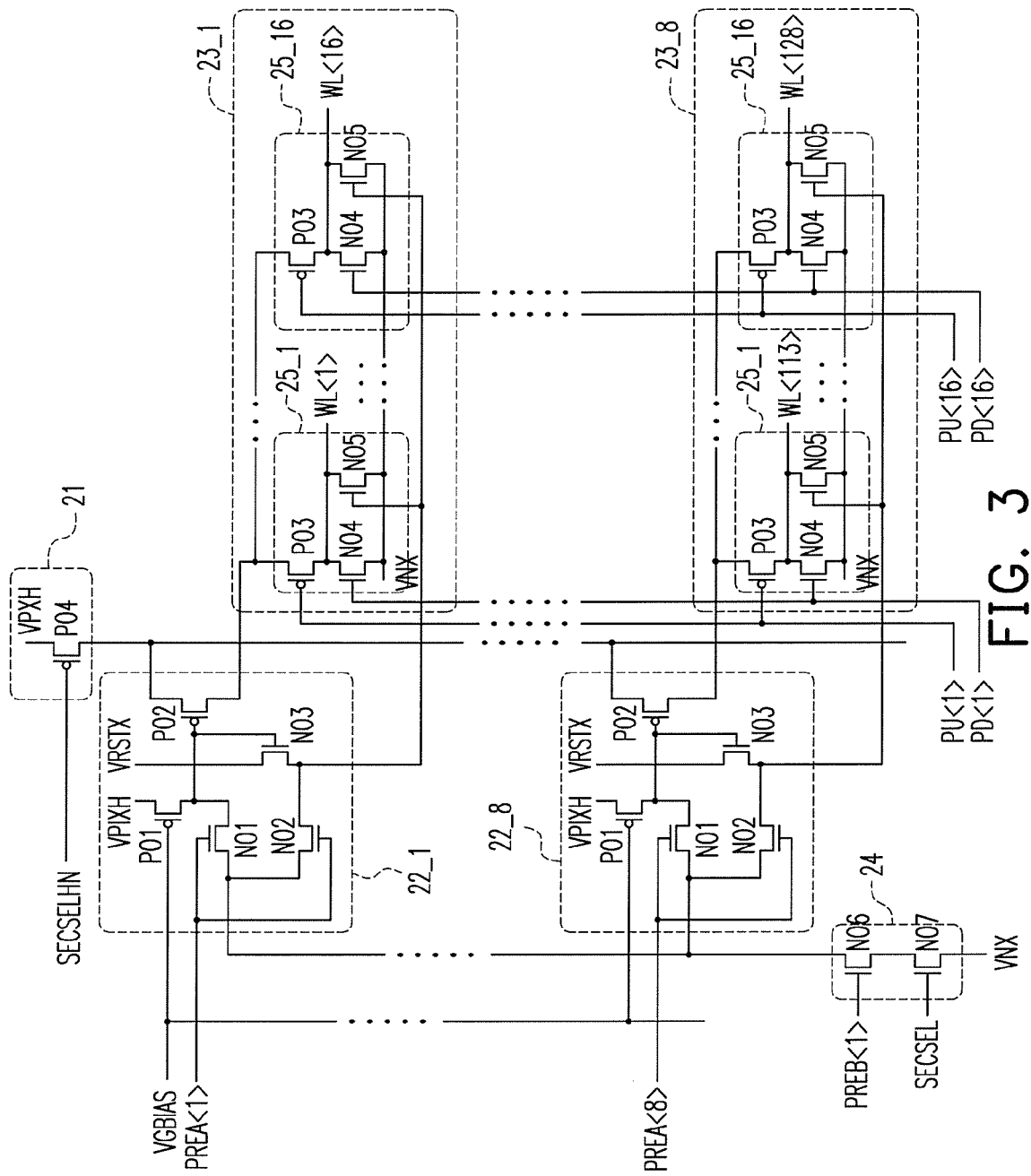
FIG. 3 is a circuit diagram showing a word line decoder 20 according to an embodiment of the present invention.

Please see FIG. 3, FIG. 3 is a circuit diagram showing a word line decoder 20 according to an embodiment of the present invention. The word line decoder circuit 20 comprises a controllable power supply 21, 8 local pre-decoders 22_1~22_8, 8 word line clusters 23_1~23_8, and a controllable pull-down circuit 24. Wherein, each of the word line clusters 23_1~23_8 has 16 row drivers 25_1~25_16.

The controllable power supply 21 is controlled by an inversed sector select signal SECSELHN to provide a first voltage VPXH to the 8 local pre-decoders 22_1~22_8. In this embodiment, the controllable power supply 21 comprises a PMOS transistor P04. A gate of the PMOS transistor P04 is coupled to the inversed sector select signal SECSELHN, a source thereof is coupled to the first voltage VPXH, and a drain thereof is coupled to the 8 local pre-decoders 22_1~22_8. In addition, the implementation of the controllable power supply 21 is not used to limit the scope of the present invention. The local pre-decoders 22_1~22_8 are controlled by the local pre-decoding signals PREA<1:8> to select the word line clusters 23_1~23_8 respectively.

The $i^{th}$ local pre-decoder (i.e. i is an integer from 1 to 8 in this embodiment) comprises two PMOS transistors P01, P02, and three NMOS transistors N01, N02, N03. A gate of the PMOS transistor P01 is coupled to a bias voltage VGBIAS, and a source thereof is coupled to a second voltage VPIXH. A gate of PMOS transistor P02 is coupled to a drain of the PMOS transistor P01, and a source thereof coupled to the controllable power supply 21. Further, a drain of the PMOS transistor P02 is coupled to the word line cluster 23_i, and the first voltage VPXH is provided to the row drivers 25_1~25_16 of the word line cluster 23_i when the PMOS transistor P02 is turned on.

A gate of the NMOS transistor N01 is coupled to a local pre-decoding signal PREA<i>, and a drain thereof is coupled to the drain of the PMOS transistor P01. A gate of the NMOS transistor N02 is coupled to the local pre-decoding signal PREA<i>. Sources of the NMOS transistors N01, N02 are coupled to the controllable pull-down circuit 24, and the sources of the NMOS transistors N01, N02 are pulled down when the controllable pull-down circuit 24 is enabled. A gate of the NMOS transistor N03 is coupled to the gate of the PMOS transistor P02, a drain thereof is coupled to a reset signal VRSTX, and a source thereof is coupled to a drain of the NMOS transistor N02 and the row drivers 25_1~25_16 of the word line cluster 23_i. The reset signal VRSTX helps to pull down the word lines WL<16*i:16*(i−1)+1> when the NMOS transistor N03 is turned on.

The controllable pull-down circuit 24 is controlled by a pre-decoding signal PREB<1> and the sector select signal SECSEL to pull down the sources of the NMOS transistors N01, N02 of the local pre-decoder 22_i to a third voltage VNX. In the embodiment, the controllable pull-down circuit 24 comprises two NMOS transistors N06, N07. A drain of the NMOS transistor N06 is coupled the sources of the NMOS transistors N01, N02, and a gate thereof is coupled to the pre-decoding signal PREB<1>. A drain of the NMOS transistor N07 is coupled to a source of the NMOS transistor N06, a gate thereof is coupled the sector select signal SECSEL, and a source thereof is coupled to the third voltage VNX. In addition, the implementation of the controllable pull-down circuit 24 is not used to limit the scope of the present invention.

The row driver 25_j (i.e. j is an integer from 1 to 16) of the word line cluster 22_i comprises a PMOS transistor P03 and two NMOS transistors N04, N05. A gate of the PMOS transistor P03 is coupled to a row driver pull-up signal PU<j>, a source thereof is coupled to the drain of the PMOS transistor P02, and a drain thereof is coupled to the word line WL<16*(i−1)+j>. A gate of the NMOS transistor N04 is coupled to a row driver pull-down signal PD<j>, a drain thereof is coupled to the drain of the PMOS transistor P03, and a source thereof is coupled to the third voltage VNX. A gate of the NMOS transistor N05 is coupled to the source of the NMOS transistor N03, a drain thereof is coupled to a drain of the PMOS transistor P03, and a source thereof is coupled to the third voltage VNX.

Figure 4:
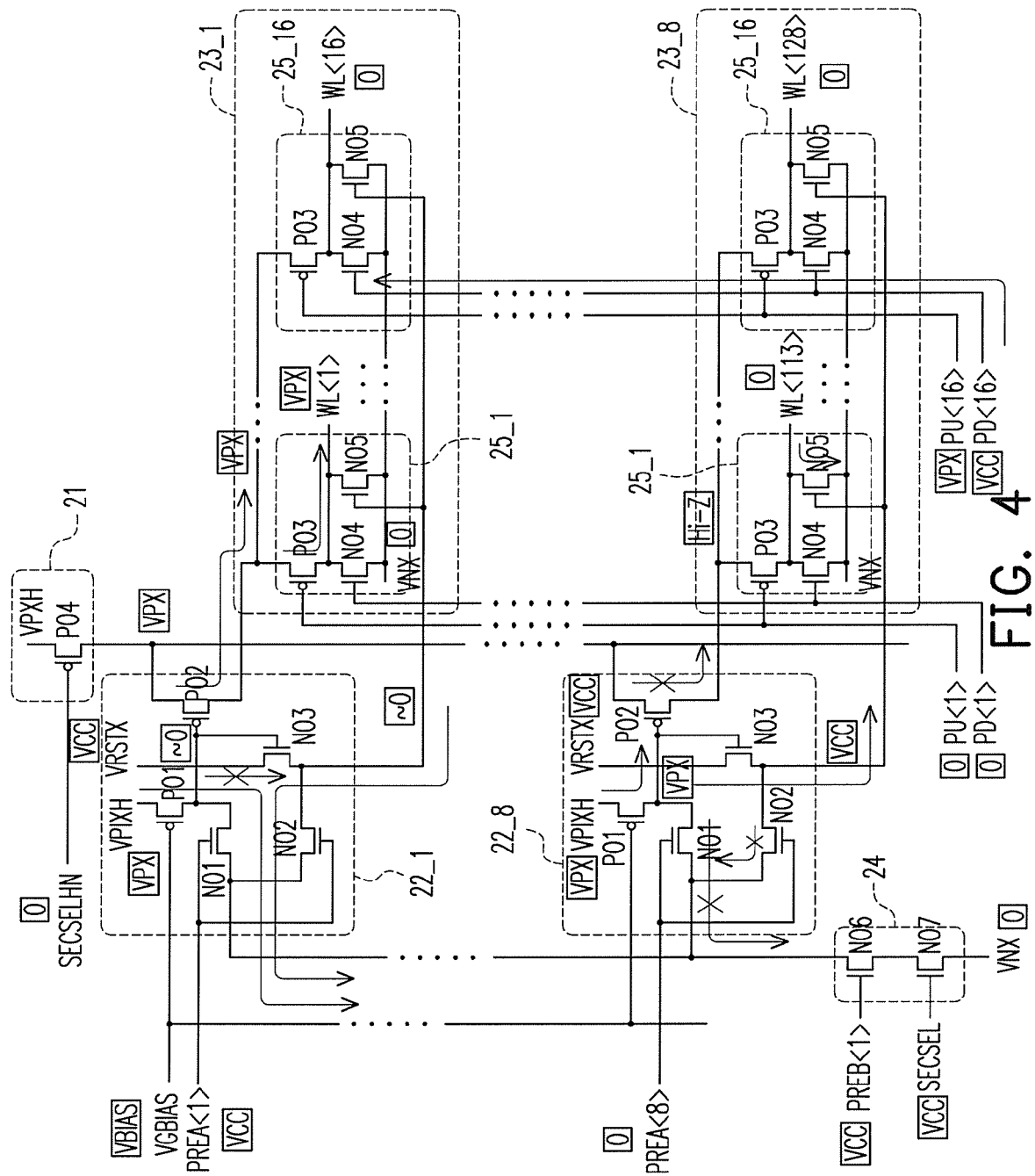
FIG. 4 is a circuit diagram showing a word line decoder 20 according to an embodiment of the present invention, when the word line WL<1> is selected.

Referring to FIG. 4, FIG. 4 is a circuit diagram showing a word line decoder 20 according to an embodiment of the present invention, when the word line WL<1> is selected. When the word line WL<1> is selected, the inversed sector select signal SECSELHN and the sector select signal SECSEL are 0 and VCC respectively, and the pre-decoding signal PREB<1> is VCC. The local pre-decoding signal PREA<1> is asserted to be VCC and the other local pre-decoding signals PREA<8:2> are 0. Further, the bias voltage VGBIAS is VBIAS, the first voltage VPXH and the second voltage VP1XH are VPX, the third voltage VNX is 0, and the reset signal VRSTX is VCC. Since only the word line WL<1> is selected, and the others word line WL<16:2> are not selected, the row driver pull-down signal PU<1> is 0, and the other row driver pull-up signal PU<1> is VPX. In addition, the row driver pull-down signal PD<1> is 0, and the other row driver pull-up signal PD<1> is VCC.

The PMOS transistor P04 is turned on, and the source thereof is VPX. The NMOS transistors N06 and N07 are turned on. For the local pre-decoder 22_1, the PMOS transistor P01 and the NMOS transistors N01, N02 are turned on. Therefore, for the local pre-decoder 22_1, one current flows from the source of the PMOS transistor P01 to the source of the NMOS transistor N01, and another one current flows from the drain to the source of the NMOS transistor N02. The NMOS transistor N02 sinks the charge on the gate of the NMOS transistors N05 of the word line cluster 23_1, so as to help to speed up the NMOS transistors N05 to cut off. The PMOS transistor P02 of the local pre-decoder 22_1 is turned on, and the drain thereof is VPX. The PMOS transistor P03 of the row driver 25_1 of the word line cluster 23_1 is turned on, and the NMOS transistors N04, N05 thereof are turned off. Therefore the word line WL<1> is VPX. Except the row driver 25_1 of the word line cluster 23_1, the NMOS transistors N04 of the word line cluster 23_1 are turned on, the PMOS transistors P03 are turned off, and the NMOS transistors N05 are turned off. Therefore, the word lines WL<16:2> are 0.

For the local pre-decoder 22_8, the PMOS transistor P01 and the NMOS transistor N03 are turned on. Therefore, for the local pre-decoder 22_8, one current flows from the source of the PMOS transistor P01 to the source of the NMOS transistor N03. The NMOS transistor N03 helps to speed up the NMOS transistors N05 to be turned on. For the local pre-decoder 22_8, the PMOS transistor P02, NMOS transistors N01, N02 are turned off. Therefore, the drain of the PMOS transistor P02 of the local pre-decoder 22_8 is high impedance. The NMOS transistor N05 of the row driver 25_1 of the word line cluster 23_8 is turned on. Therefore the word line WL<113> is 0 since the NMOS transistor N05 is turned on. Except the row driver 25_1 of the word line cluster 23_8, the NMOS transistors N04 and N05 of the word line cluster 23_8 are turned on. Therefore, the word lines WL<128:114> are 0.

Accordingly, for the local pre-decoder 22_1, the drain of the NMOS transistor N02 is a voltage drop VDS of the voltage at the gate of the PMOS transistor P02 (i.e. the voltage drop VDS of the voltage at the gate of the PMOS transistor P02 is approximate to 0). The voltage at the drain of the NMOS transistor N02 of the local pre-decoder 22_1 is severed as the control signal to turn off the NMOS transistors N05 of the word line cluster 23_1. Even the channel size of the PMOS transistor P01 of the local pre-decoder 22_1 is large, but the risk of turning on the NMOS transistors N05 of the row driver 25_1 of the word line cluster 23_1 can be reduced. That is, the selected word line WL<1> can reach to VPX, and the speed to VPX thereof is fast. In other hand, for the local pre-decoder 22_8, the source of the NMOS transistor N03 is VCC. If the channel size of the PMOS transistor P01 of the local pre-decoder 22_8 is large, the voltage of the source of the NMOS transistor N03 is charged to VCC fast, so as to discharge the non-selected word line WL<128:113> to 0 fast.

In the word line decoder circuit 20, the voltages at the NMOS transistors N03 of the pre-decoders 22_2~22_8 are charged to VCC instead of VPX. Further, the row drivers are selected by the row driver pull-up signals and the row driver pull-down signal to control the corresponding PMOS transistors and NMOS transistors, so as to both reduce the power of VPX pumps. Accordingly, compared to the conventional word line decoder circuit, the power consumption of the word line decoder circuit 20 is reduced.

Figure 5:
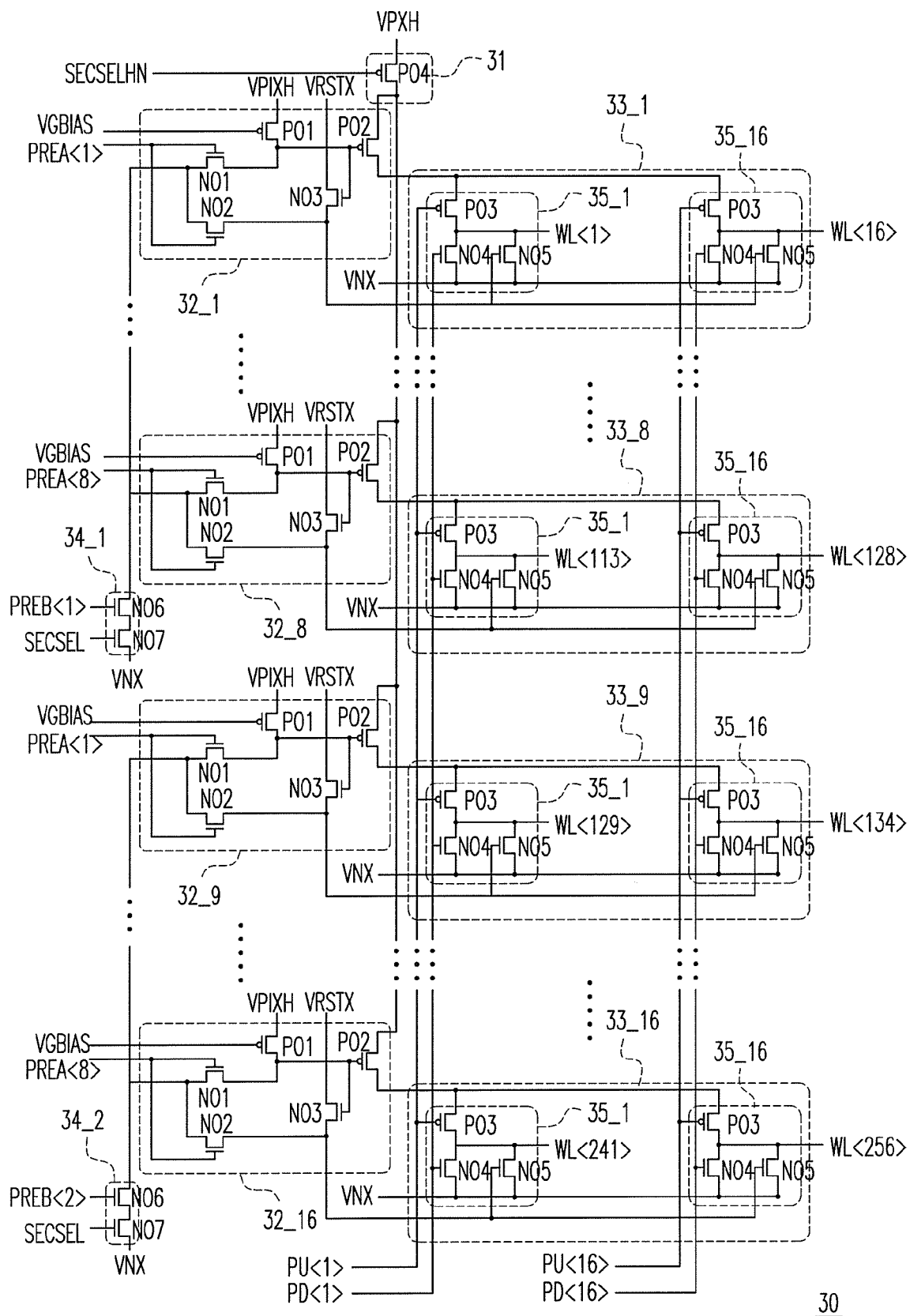
FIG. 5 is circuit diagram showing a word line decoder circuit 30 provided by an embodiment of the present invention.

Referring to FIG. 5, FIG. 5 is circuit diagram showing a word line decoder circuit 30 provided by an embodiment of the present invention. In this embodiment, the word line decoder circuit 30 comprises a controllable power supply 31, 16 local pre-decoders 32_1~32_16, 16 word line clusters 33_1~33_16, and two controllable pull-down circuit 34_1~34_2. Wherein, each of the word line clusters 33_1~33_16 has 16 row drivers 35_1~35_16. The differences of the FIG. 3 between FIG. 5 are the added local pre-decoders 32_9~32_16 and the added controllable pull-down circuit 34_2 which are controlled by the pre-decoding signal PREB<2>. However these embodiments are not used to limit the scope of the invention, the numbers of the local pre-decoders, the controllable pull-down circuits, the word line clusters, and the row drivers may be modified to meet the requirements on the different applications.

Figure 6:
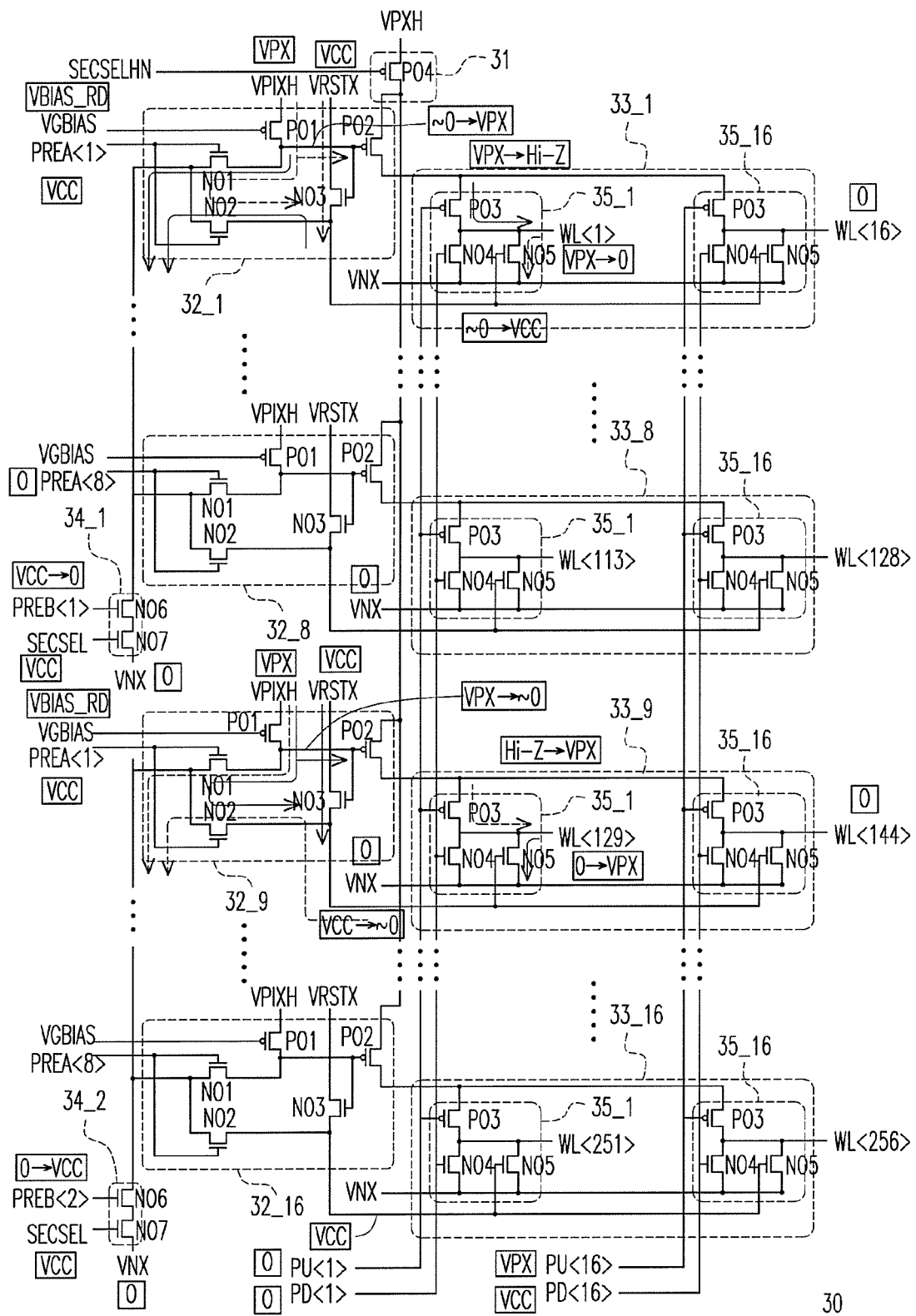
FIG. 6 is circuit diagram showing a word line decoder circuit 30 provided by an embodiment of the present invention when the pre-decoding signal PREB<1> changes to 0 from VCC and the pre-decoding signal PREB<2> changes to VCC from 0.

Referring to FIG. 6, FIG. 6 is circuit diagram showing a word line decoder circuit 30 provided by an embodiment of the present invention when the pre-decoding signal PREB<1> changes to 0 from VCC and the pre-decoding signal PREB<2> changes to VCC from 0. When the pre-decoding signal PREB<1> changes to 0 from VCC, the solid current paths in the local pre-decoder 32_1 and the word line cluster 331 change into the dotted current paths therein. The gate of the PMOS transistor P02 of the local pre-decoder 32_1 changes to VPX from 0, and the drain thereof changes from VPX to high impedance. The source of the NMOS transistor N03 of the local pre-decoder 32_1 changes to VCC from 0, and therefore the word line WL<1> changes from VPX to 0. When the pre-decoding signal PREB<2> changes to VCC from 0, the solid current paths in the local pre-decoder 32_9 and the word line cluster 33_9 change into the dotted current paths therein. The gate of the PMOS transistor P02 of the local pre-decoder 32_16 changes to 0 from VPX, and the drain thereof changes to VPX from high impedance. The source of the NMOS transistor N03 of the local pre-decoder 32_1 changes to 0 from VCC, and therefore the word line WL<129> changes from 0 to VPX.

Accordingly, the word line decoder circuit provided by the embodiment of the present invention separates the row driver select signals into the row driver pull-down signals and the row driver pull-up signals to control the corresponding NMOS transistors and the PMOS transistors in the row drivers. Further, the voltages to control the NMOS transistors to let the non-selected word lines discharge to 0 are VCC instead of VPX. Therefore the power consumption is reduced. In addition, in the word line decoder circuit, the selected word line is charged to VCC fast, and the non-selected word lines are discharged to 0 fast. In summary, compared to the conventional word line decoder circuit, the power consumption of the word line decoder circuit is reduced, and the operation speed of the word line decoder circuit is enhanced.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A word line decoder circuit, comprising:
    a controllable power supply, controlled by an inversed sector select signal to provide a first voltage to at least one local pre-decoder;
    the local pre-decoder, comprising:
        a first PMOS transistor, a gate thereof is coupled to a bias voltage, and a source thereof is coupled to a second voltage;
        a second PMOS transistor, a gate thereof is coupled to a drain of the first PMOS transistor, and a source thereof coupled to the controllable power supply;
        a first NMOS transistor, a gate thereof is coupled to a local pre-decoding signal, and a drain thereof is coupled to the drain of the first PMOS transistor;
        a second NMOS transistor, a gate thereof is coupled to the local pre-decoding signal; and
        a third NMOS transistor, a gate thereof is coupled to the gate of the second PMOS transistor, a drain thereof is coupled to a reset signal, and a source thereof is coupled to a drain of the second NMOS transistor;
    at least one word line cluster, comprising at least one row driver, and the row driver comprises:
        a third PMOS transistor, a gate thereof is coupled to a row driver pull-up signal, a source thereof is coupled to a drain of the second PMOS transistor, and a drain thereof is coupled to a word line;
        a fourth NMOS transistor, a gate thereof is coupled to a row driver pull-down signal, a drain thereof is coupled to the drain of the third PMOS transistor, and a source thereof is coupled to a third voltage; and
        a fifth NMOS transistor, a gate thereof is coupled to the source of the third NMOS transistor, a drain thereof is coupled to a drain of the third PMOS transistor, and a source thereof is coupled to the third voltage; and
    at least one controllable pull-down circuit, coupled to sources of the first and second NMOS transistors of the local pre-decoder, controlled by a pre-decoding signal and a sector select signal to pull down the sources of the second and third NMOS transistors of the local pre-decoder to the third voltage.

2. The word line decoder circuit according to claim 1, wherein the controllable power supply comprises a fourth PMOS transistor, wherein a gate of the fourth PMOS transistor is coupled to the inversed sector select signal, a source of the fourth PMOS transistor is coupled to the first voltage, and a drain of the fourth PMOS transistor is coupled to the source of the second PMOS transistor.

3. The word line decoder circuit according to claim 1, wherein the controllable pull-down circuit comprises:
    a sixth NMOS transistor, a drain thereof is coupled the sources of the first and second transistors, and a gate thereof is coupled to the pre-decoding, signal; and
    a seventh NMOS transistor, a drain thereof is coupled to a source of the sixth NMOS transistor, a gate thereof is coupled the sector select signal, and a source thereof is coupled to the third voltage.

4. The word line decoder circuit according to claim 1, wherein when the first PMOS transistor is turned on, the local pre-decoding, signal and the pre-decoding signal are VCC, the sector select signal and the inversed sector select signal are VCC and 0 respectively, the first and second voltage are VPX, the third voltage is 0, and the row driver pull-up signal and the row driver pull-down signal are 0, then the word line is VPX, the drain of the second PMOS transistor is VPX, and the source of the third NMOS transistor is a voltage drop VDS of the voltage at the gate of the second PMOS transistor, wherein VDS is the voltage difference between the drain and source of the first NMOS transistor.

5. The word line decoder circuit according to claim 4, wherein the first and second NMOS transistors are turned on, the third NMOS transistor is turned off, and the second PMOS transistor is turned on.

6. The word line decoder circuit according to claim 1, wherein when the first PMOS transistor is turned on, the local pre-decoding signal is 0, the pre-decoding signal are VCC, the sector select signal and the inversed sector select signal are VCC and 0 respectively, the first and second voltage are VPX, the third voltage is 0, and the row driver pull-up signal and the row driver pull-down signal are 0, then the word line is 0, the drain of the second PMOS transistor is high impedance, and the source of the third NMOS transistor is VCC.

7. The word line decoder circuit according to claim 6, wherein the first and second NMOS transistors are turned off, the third NMOS transistor is turned on, and the second PMOS transistor is turned off.

8. The word line decoder circuit according to claim 1, wherein when the first PMOS transistor is turned on, the local pre-decoding signal is VCC, the pre-decoding signal is 0, the sector select signal and the inversed sector select signal are VCC and 0 respectively, the first and second voltage are VPX, the third voltage is 0, and the row driver pull-up signal and the row driver pull-down signal are 0, then the word line is 0, the drain of the second PMOS transistor is high impedance, and the source of the third NMOS transistor is VCC.

9. The word line decoder circuit according to claim 8, wherein the first second, and third NMOS transistors are turned on, and the second PMOS transistor is turned off.

* * * * *